United States Patent

Braun

(10) Patent No.: US 6,847,072 B2
(45) Date of Patent: Jan. 25, 2005

(54) LOW SWITCHING FIELD MAGNETIC ELEMENT

(75) Inventor: Daniel Braun, Ossining, NY (US)

(73) Assignee: Infineon Technologies Aktiengessellschaft, Munich (DE)

( * ) Notice: Subject to any disclaimer, the term of this patent is extended or adjusted under 35 U.S.C. 154(b) by 80 days.

(21) Appl. No.: 10/249,531

(22) Filed: Apr. 17, 2003

(65) Prior Publication Data

US 2004/0206992 A1 Oct. 21, 2004

(51) Int. Cl.$^7$ .............................................. H01L 29/76
(52) U.S. Cl. ..................... 257/295; 257/298; 257/303; 257/306; 257/324; 438/3; 438/240
(58) Field of Search .................... 257/68, 71, 295–314, 257/324–326; 438/3, 240

(56) References Cited

U.S. PATENT DOCUMENTS

2001/0031374 A1 * 10/2001 Whang et al. .............. 428/607

* cited by examiner

*Primary Examiner*—David Nelms
*Assistant Examiner*—Andy Huynh
(74) *Attorney, Agent, or Firm*—Slater & Matsil, L.L.P.

(57) ABSTRACT

A magnetic element which can switch states using a relatively lower magnetic field. The magnetic element comprises first and second magnetic layers separated by an intermediate layer. The magnetization of the first magnetic layer is fixed in a first direction parallel to the easy axis. The second magnetic layer comprises first and second magnetization vectors which are in opposite directions to create a magnetic boundary therein. The magnetic boundary can be driven out of the second magnetic layer by shifting the boundary along a first or second direction along the easy axis.

20 Claims, 3 Drawing Sheets

LOW SWITCHING FIELD MAGNETIC ELEMENT

BACKGROUND OF INVENTION

Ferromagnetic elements are used, for example, to form non-volatile memory cells. A plurality of such memory cells are interconnected by bitlines or sense lines and wordlines to create an array of storage elements for storing information. FIG. 1 shows a conventional ferromagnetic element 105. As shown, the magnetic element includes bottom and top magnetic layers 110 and 130. The magnetic layers, for example, comprise cobalt-iron or nickel-cobalt-iron. A non-magnetic layer 120 separates the first and second magnetic layers. The non-magnetic layer, for example, comprises an insulating material, such as aluminum oxide, to form a magnetic tunnel junction (MTJ) type element.

The magnetic element is typically rectangular or elliptical in shape, having a width and length L. The magnetic layers of the element are formed with an easy axis along the length L and a hard axis along the width. The magnetic vector 111 in the bottom layer is fixed or pinned in a first direction parallel to the easy axis. The bottom layer with the fixed magnetic vector is referred to as the reference or fixed layer. The magnetic vector 131 in the top magnetic layer can be switched between first and second (opposite) directions parallel to the easy axis. As such, the magnetic vectors in the layers can be oriented parallel or antiparallel to each other. The top magnetic layer with switchable magnetic vector is referred to as the storage or free layer.

The direction of the vectors in the top layer can be switched by the application of a magnetic field generated by passing a write current through, for example, the wordline. Depending on the magnetic field generated, the magnetic vector in the second layer either switches direction or remains the same. The magnetic element would have first and second resistance values based on whether the magnetic vectors are oriented parallel or anti-parallel, representing first and second logic states stored. For example, the magnetic element will have a high resistance value when the vectors of the layer are antiparallel to represent a logic 1 or a low resistance when the vectors are parallel to represent a logic 0. The states stored in the element can be read by passing a sense current through the element and sensing the difference between the resistances.

However, conventional magnetic elements require relatively large magnetic fields to switch the magnetic vector in the storage layer. In order to generate a sufficient magnetic field to switch the magnetic vector, a relatively high current is required. This results in a higher power consumption. Furthermore, larger switching currents are needed as cells size become smaller. The need for larger switching currents is undesirable, as this leads to a decrease in reliability, higher operating costs and in the case of mobile applications, shorter battery life.

From the foregoing discussion, it is desirable to provide a magnetic element which can switch with a low switching field.

SUMMARY OF INVENTION

The invention relates generally to magnetic elements, such as those used in magnetic memory cells. More particularly, the invention relates to magnetic elements which require lower magnetic fields to change states. Lower switching fields result in lower operating currents needed, thus reducing power consumption. In one embodiment, the magnetic element comprises an easy and hard axis which are perpendicular to each other. First and second magnetic layers are separated by an intermediate layer. The first magnetic layer has its magnetization fixed in a first direction parallel to the easy axis. In accordance with one embodiment of the invention, the second magnetic layer comprises first and second magnetization vectors which are in opposite directions to create a magnetic boundary in the second magnetic layer. The magnetic boundary is along the direction of the hard axis. The magnetic boundary can be driven out of the second magnetic layer by shifting the boundary along a first or second direction along the easy axis.

DETAILED DESCRIPTION

The invention relates generally to ferromagnetic elements, such as those employed to form magnetic random access memory (MRAM) cells. The memory cell can be used to form non-volatile memory ICs. Other types of ICs (e.g., system on a chip) having such memory arrays embedded are also useful. The ICs, for example, are integrated into consumer products such as computer systems, cellular phones, personal digital assistants (PDAs), or other types of electronic products.

Figure 1:
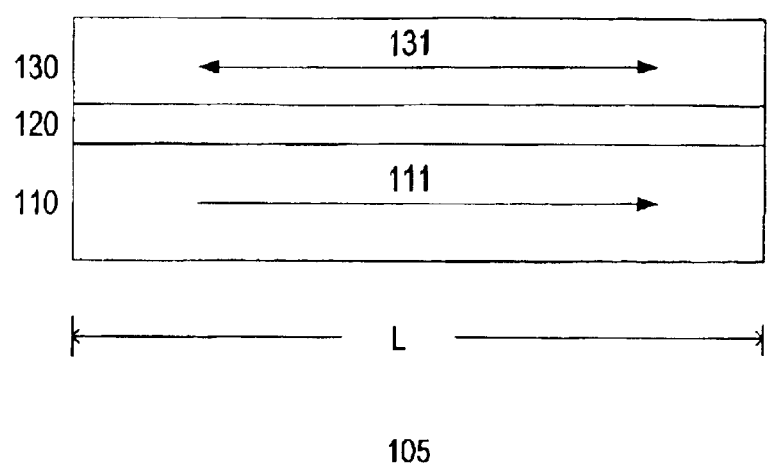
FIG. 1 shows a conventional magnetic element.
Figure 2:
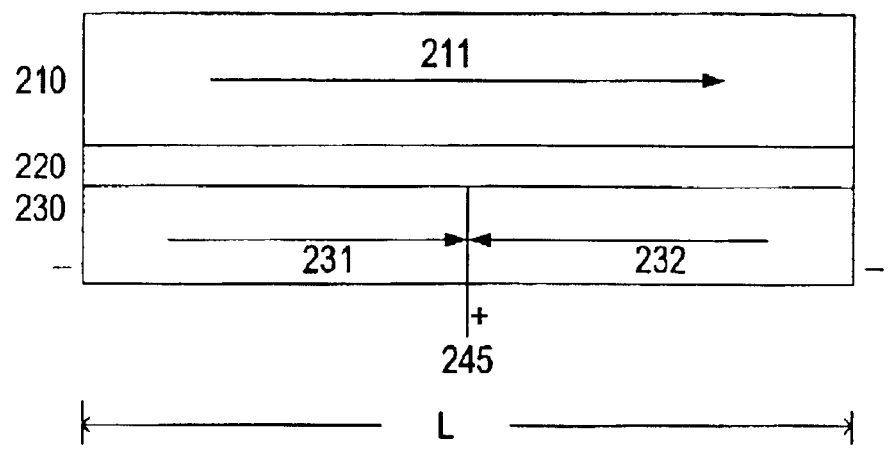
FIG. 2 shows a magnetic element in accordance with one embodiment of the invention.

FIG. 2 shows a magnetic element 205 in accordance with one embodiment of the invention. For purposes of discussion, the z-axis is in the vertical direction with the positive z-direction toward the top, the y-axis is in the horizontal direction with the positive y-direction toward the right, and the x-axis is perpendicular to both the z and y-axes with the positive x direction coming out of the drawing.

The magnetic element comprises first and second magnetic layers 210 and 230. The magnetic layers can be formed from ferromagnetic materials, such as nickel, iron, cobalt, alloys or combinations thereof. Other types of ferromagnetic materials can also be useful. The thickness of the magnetic layers can be about 15 nm. Other thicknesses are also useful. It is understood that the first and second layers need not be formed of the same materials nor have the same thickness. For example, one of the layers comprises nickel-iron (NiFe) and the other comprises cobalt-iron (CoFe). Providing one or both magnetic layers formed from a composite ferromagnetic material having more than one magnetic layer is also useful. The composite layer can also be formed with a combination of ferromagnetic and non-ferromagnetic materials. The non-ferromagnetic material is, for example, conductive. Other types of composite layers are also useful.

The first and second magnetic layers are separated by a non-magnetic intermediate layer 220. In one embodiment, the non-magnetic intermediate layer comprises an insulating material, such as aluminum oxide. Other types of insulating materials, including aluminum nitride, are also useful. Separating the magnetic layers with an insulating layer creates a magnetic tunnel junction (MTJ) type element. Forming other types of magnetic elements are also useful. For example, the magnetic layers can be separated by a conductive intermediate layer (e.g., copper) to create a giant magnetoresistive (GMR) type magnetic element.

The magnetic element generally is rectangular or elliptical in shape having a length L and a width. In one embodiment, the width of the cell is about 100–600 nm and the length is about 200 nm 5 um. Forming cells with other dimensions are also useful. Furthermore, other cell shapes, such as rectangular or oval, are also useful. In one embodiment, the magnetic element is formed with an easy axis of magnetization along its length L and a hard axis is parallel to its width. Providing a cell shape having length larger than the width is preferable since such configuration aligns the magnetization of the layers along the direction of the length (parallel or anti-parallel) by shape anisotropy. As illustrated, the length is parallel to the y-axis and width is parallel to the x-axis. The magnetic element comprises first and second ends 207 and 208 along the length of the element. The magnetic vectors in the layers are aligned parallel to the easy axis (e.g., parallel to length of element). Aligning the magnetic vectors of the layers in other directions is also useful. Aligning the magnetic vectors of the layers along a preferred direction (e.g., length) can also be achieved by other techniques, such as intrinsic anisotropy. This is particularly useful for other cell shapes, such as rectangular or oval or aligning the magnetic vectors in directions other than along the length.

The first magnetic layer comprises a magnetic vector which is fixed or pinned in a first direction parallel to the easy axis (e.g., length of element), creating the reference layer. The first direction, for example, is in the positive y-direction, as depicted by the arrow 211. Providing a fixed magnetic vector in the negative y-direction (e.g., to the left) is also useful. In a preferred embodiment, the reference layer is located above the non-magnetic layer. Locating the reference layer below the non-magnetic layer is also useful.

In one embodiment, the reference layer comprises multiple layers. In one embodiment, the reference layer comprises first and second magnetic layers separated by a conductive layer. The reference layer comprises, for example, a first magnetic layer of either CoFe or NiFe and a second magnetic layer of CoFe separated by a ruthenium (Ru) layer. Other combinations of magnetic and conductive materials are also useful.

In another embodiment, the reference layer further comprises an antiferromagnetic layer. The antiferromagnetic layer comprises, for example, platinum manganese (PtMn). Other antiferromagnetic materials are also useful. The antiferromagnetic layer increases the pinning effect on the reference layer. In one embodiment, the reference layer, from the intermediate layer, comprises first magnetic, conductive, second magnetic, and antiferromagnetic layers. In one embodiment, the first magnetic layer comprises either CoFe or NiFe, the conductive layer comprises Ru, the second magnetic layer comprises CoFe, and the antiferromagnetic layer comprises PtMn. Other combinations of magnetic, conductive, and antiferromagnetic materials are also useful. The thickness of the various layers are selected to achieve the desired characteristics. For example, the thickness of the first magnetic layer is about 22 A, the conductive layer is about 9 A, the second magnetic layer is about 18 A, and the antiferromagnetic layer is about 175 A. Other thicknesses are also useful In one embodiment, the magnetic element is associated with a switching conductor (not shown). Various materials, such as copper or aluminum, can be used to form the conductor. Other conductive materials are also useful. The switching conductor is magnetically coupled to the magnetic element. It is understood that the conductor is not necessarily electrically coupled to the magnetic element. Depending on the design or architecture, the switching conductor can be electrically coupled to or decoupled from the magnetic element. For example, the magnetic element can be implemented in a cross-point or FET architecture. Other types of memory architectures are also useful. Preferably, the switching conductor is perpendicular to the easy axis of the magnetic cell. Providing the switching conductor which is associated with the cell in other directions is also useful.

In a preferred embodiment, the switching conductor is located adjacent to the storage or free layer. More preferably, the storage layer is located below the intermediate layer and the switching conductor is disposed below the storage layer. Providing the storage layer located above the intermediate layer and the switching conductor above the storage layer or other configurations are also useful.

In accordance with the invention, the second magnetic or storage layer comprises first and second of magnetic vectors 231 and 232 which point in different directions along the easy axis. In one embodiment, the first and second magnetic vectors point towards each other. Providing first and second magnetic vectors which point away from each other is also useful. Illustratively, the first magnetic vector points in the positive y-direction and the second magnetic vector points in the negative y-direction.

By having first and second magnetic vectors which point in different directions, a magnetic boundary 245 is created. The boundary, in one embodiment, is an extended region which is parallel to the hard axis of the magnetic element. The boundary can be defined as $divM \neq 0$, where div is the divergence (i.e., a vector operator) and M is the magnetization. divM can be greater or less than zero, depending on whether the vectors point towards each other or away from each other.

With the basic equation $\rho = -4\pi \, divM$, where $\rho$ is the magnetic charge, then the boundary would have a charge having a first polarity (e.g., positive). Both edges 207 and 208 of the storage layer would have a charge having a second (opposite) polarity (e.g., negative). For example, if M is greater than 0, then the boundary would have a positive charge and the edges would have a negative charge.

The magnetic boundary can be driven out of the storage layer by shifting it either to the first or second end of the magnetic element (e.g., negative or positive y-direction). Shifting of the boundary can be achieved by applying a write current through the switching conductor. In some applications, more than one conductor can be employed to provide the write current (e.g., half write or asymmetrical write architectures).

Depending on the magnitude and direction of the current, the boundary is shifted either to the left or right. Driving out the boundary layer annihilates one of the first or second magnetic vectors, resulting in uniform or substantially uniform magnetization in the storage layer. The magnetization in the storage layer remains stable after the current is removed. The magnetic boundary can be reinitialized by the application of a current in the opposite direction. By providing a storage layer having a boundary with a charge of a first polarity and the ends with an opposite polarity, switching can be achieved with a smaller magnetic field. As a result, a smaller amount of current is needed to write to the magnetic cell, thus reducing power consumption.

As an example, if a sufficient current is passed through the second conductor in the negative x-direction, the boundary would be shifted to the right. Once the boundary is driven out of the magnetic element, the second magnetic vector is annihilated while the first magnetic vector remains. This results in the storage layer having a magnetic vector pointing in the positive y-direction. On the other hand, the boundary can be shifted to the left if a sufficient current is applied in the positive x-direction, resulting in the magnetic vector pointing in the negative y-direction. Thus, the magnetic vectors in the first and second layers can be configured to be parallel or anti-parallel by shifting the magnetic boundary in the second layer in one or the other direction.

A plurality of magnetic elements can be interconnected by first and second conductors to form a memory array. The conductors, for example, are orthogonal to each other. Providing conductors which intersect at other angles are also useful. The first conductors, for example, are referred to as wordlines and the second conductors are referred to as bitlines. The memory elements can be arranged in various types of architectures, such as x-point or FET. Such types of architectures are described in, for example, Reohr et al., IEEE ISSCC Dig. Tech. Papers, 2000, pp. 128–129 and U.S. Pat. No. 5,793,697, which are herein incorporated by reference for all purposes. Other types of architectures are also useful. Additionally, the write current can be applied to more than one conductor, such as in half write or asymmetrical write architectures. Half and asymmetrical write architectures are described in, for example, U.S. Pat. Nos. 6,134,139 and 6,111,783, which are herein incorporated by reference for all purposes.

Figure 3:
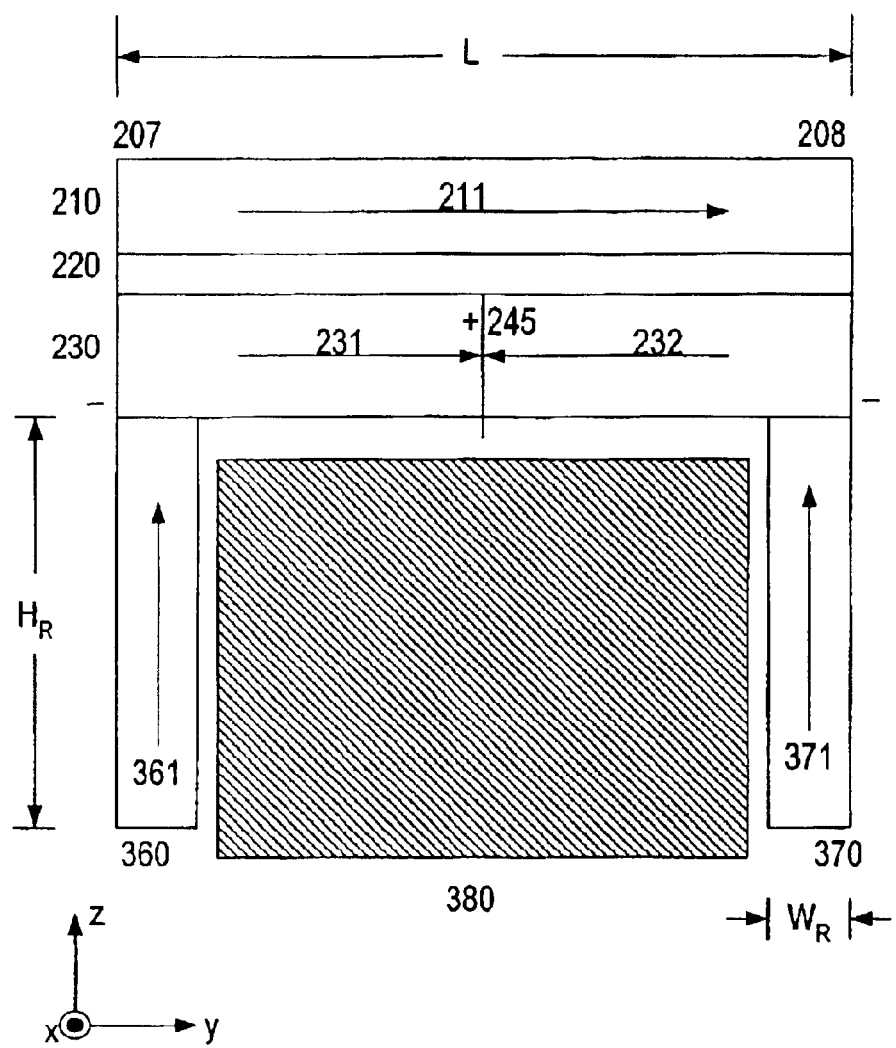
FIG. 3 shows a magnetic element in accordance with another embodiment of the invention.

FIG. 3 shows a magnetic element in accordance with one embodiment of the invention. The magnetic element is similar to the magnetic element described in FIG. 2, with like reference numbers referring to similar or like elements. In one embodiment, first and second magnetic reservoirs 360 and 370 are respectively located adjacent to first and second ends 207 and 208 of the magnetic element along the easy axis. The magnetic reservoirs are magnetically coupled to the storage layer of the magnetic element. Preferably, the magnetic reservoirs are adjacent to the storage layer. More preferably, the magnetic reservoirs are electrically coupled to the storage layer of the magnetic element. Providing magnetic reservoirs which are not electrically coupled or adjacent to the storage layer is also useful.

In a preferred embodiment, the storage layer is located beneath the intermediate layer and the magnetic reservoir located beneath the magnetic element adjacent the storage layer. Locating storage layer above the intermediate layer and magnetic reservoirs above the magnetic element is also useful. Other configurations are also useful.

The magnetic reservoirs each comprises magnetic vectors which intersect the plane formed by the easy and hard axes. Preferably, the magnetic vectors in the reservoirs intersect the plane formed by easy and hard axes at about 90° (i.e., perpendicular). The magnetic vectors in both reservoirs are in the same direction (e.g., toward or away from the storage layer). In this sense, the magnetic reservoirs can be referred to as "frustrated magnetic reservoirs" since the natural tendency is for vectors in the different reservoirs to be in opposite directions. The magnetization of the magnetic reservoirs can be configured using shape and/or intrinsic anisotropy.

In one embodiment, the magnetic vectors in the magnetic reservoirs should be sufficient to create the boundary 245 in the magnetic element. However, the magnetic reservoirs should not affect the reference layer. For example, the magnetization in the reference layer should always be fixed in either the positive or negative y-direction, even in the presence of the current used to shift the boundary. More preferably, the magnetic vectors in the magnetic reservoirs point towards the storage layer, creating magnetic vectors in the magnetic element which point towards each other. Aligning the magnetic vectors in the magnetic reservoirs which point away from each other is also useful. This results in the first and second magnetic vectors in the storage layer pointing away from each other (e.g., away from the boundary). Alternatively, other techniques for creating the boundary can be employed.

In one embodiment, the magnetic reservoirs comprise structures formed from a magnetic material. Various magnetic materials, such as permalloy, cobalt, iron, nickel, alloys or combinations thereof can be used to form the magnetic reservoirs. Other types of magnetic materials are also useful. The magnetic structure can be formed using conventional deposition patterning techniques used to form magnetic structures.

In an illustrative embodiment, the magnetic structures are located below the magnetic element and have their magnetization in the positive z-direction, as indicated by magnetic vectors 361 and 371. The magnetic structures, each comprises a width $W_R$, length $L_R$ and height $H_R$. Preferably, the magnetic structures have the same dimensions. The height of the magnetic structure is along the z-axis. Preferably, the height of the magnetic structure is parallel to the z-axis. The length of the magnetic structure is along the x-axis and preferably parallel to the x-axis.

A switching conductor 380 is associated with the magnetic element. The switching conductor, in one embodiment, is along the hard axis (i.e., x direction). Providing the switching conductor along other directions is also useful. In one embodiment, the switching conductor is magnetically coupled to the storage layer. Preferably, the switching conductor is disposed between the magnetic reservoirs. The switching conductor can be electrically coupled to or isolated from the magnetic reservoirs. Providing the switching conductor which is electrically coupled to the storage layer but on the opposite side of the magnetic element which the magnetic reservoirs are located is also useful.

A write current can be passed through the switching conductor. Depending on the magnitude and direction of the current, the boundary is shifted or driven out of the magnetic element either to the left or right. Driving out the boundary layer annihilates one of the first or second magnetic vectors, resulting in uniform or substantially uniform magnetization in the storage layer. The magnetic boundary can be reinitialized by the application of a current in the opposite direction. An opposite current with sufficient magnitude would reinitialize the boundary. The boundary would be driven out of the magnetic element from the other end, effectively switching the direction of the magnetic vector in the storage layer.

As previously discussed, the boundary can be positively charged while the ends of the storage layers are negatively charged. The reservoirs may create some positive charges at the ends of the storage layer if the magnetic flux closure therein is not perfect. However, this does not affect the basic switching mechanism in the storage layer (e.g., driving the boundary out of the storage layer). It has been found that the strayfield from the reservoirs remain effectively the same, independent of the position of the boundary. This means that the magnetization in the reservoirs is not Impacted by the position of the boundary. As a result, energy is gained as the boundary is driven out of the storage layer, enabling the vectors in the storage layer to be effectively switched with a smaller magnetic field.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A magnetic element comprising:
   the magnetic element comprising an easy and hard axis which are perpendicular to each other;
   a first magnetic layer having magnetization fixed in a first direction along the easy axis;
   a second magnetic layer;
   an intermediate layer separating the first and second magnetic layers; and
   wherein the second magnetic layer comprises first and second magnetization vectors which are in opposite directions along the easy axis to create a magnetic boundary in the second magnetic layer, the magnetic boundary is along the direction of the hard axis, the magnetic boundary being able to be driven out of the second magnetic layer by shifting the boundary along a first or second direction along the easy axis.

2. The magnetic element of claim 1 wherein the first and second magnetic vectors in the second magnetic layer point toward each other.

3. The magnetic element of claim 2 wherein the boundary comprises a charge of a first polarity equal to about $-4\pi \, \mathrm{div} M$, where div is equal to divergence and M is equal to the magnetization, and first and second ends of the storage layer each having a charge of a second polarity.

4. The magnetic element of claim 2 wherein the second layer is located below the intermediate layer.

5. The magnetic element of claim 2 further comprises a write conductor in magnetic coupling with the second layer, the write conductor being along a direction of the hard axis.

6. The magnetic element of claim 2 further comprises first and second magnetic reservoirs, the first and second magnetic reservoirs located adjacent to the first and second ends of the magnetic element along the easy axis and magnetically coupled to the second layer, the first and second magnetic reservoirs comprising magnetic vectors which point toward the magnetic element and intersect a plane formed by the easy and hard axes.

7. The magnetic element of claim 6 wherein the write conductor is disposed between the first and second magnetic reservoirs.

8. The magnetic element of claim 6 wherein the magnetic reservoirs comprise magnetic structures, each having a height, width, and length, the height of the magnetic structures intersect the plane formed by the easy and hard axes, the width along the easy axis, and the length along the hard axis.

9. The magnetic element of claim 8 wherein the write conductor is disposed between the first and second magnetic reservoirs.

10. The magnetic element of claim 1 wherein the boundary comprises a charge of a first polarity equal to about $-4\pi \, \mathrm{div} M$, where div is equal to divergence and M is equal to the magnetization, and first and second ends of the storage layer each having a charge of a second polarity.

11. The magnetic element of claim 10 wherein the second layer is located below the intermediate layer.

12. The magnetic element of claim 10 further comprises a write conductor in magnetic coupling with the second layer, the write conductor being along a direction of the hard axis.

13. The magnetic element of claim 1 wherein the second layer is located below the intermediate layer.

14. The magnetic element of claim 13 further comprises a write conductor in magnetic coupling with the second layer, the write conductor being along a direction of the hard axis.

15. The magnetic element of claim 1 further comprises a write conductor in magnetic coupling with the second layer, the write conductor being along a direction of the hard axis.

16. The magnetic element of claim 1 further comprises first and second magnetic reservoirs, the first and second magnetic reservoirs located adjacent to the first and second ends of the magnetic element along the easy axis and magnetically coupled to the second layer, the first and second magnetic reservoirs comprising magnetic vectors which are either pointing towards or away from the magnetic element and intersect a plane formed by the easy and hard axes.

17. The magnetic element of claim 16 wherein the write conductor is disposed between the first and second magnetic reservoirs.

18. The magnetic element of claim 16 wherein the magnetic reservoirs comprise magnetic structures, each having a height, width, and length, the height, the height of the magnetic structures intersect the plane formed by the easy and hard axes, the width along the easy axis, and the length along the hard axis.

19. The magnetic element of claim 18 wherein the write conductor is disposed between the first and second magnetic reservoirs.

20. A magnetic memory cell comprising:
    a magnetic element, the magnetic element comprises an easy and hard axis which are perpendicular to each other,
    a first magnetic layer having magnetization fixed in a first direction parallel to the easy axis,
    a second magnetic layer,
    an intermediate layer separating the first and second magnetic layers, and
    wherein the second magnetic layer comprises first and second magnetization vectors which are in opposite directions to create a magnetic boundary in the second magnetic layer, the magnetic boundary is along the direction of the hard axis, the magnetic boundary being able to be driven out of the second magnetic layer by shifting the boundary along a first or second direction along the easy axis; and
    a write conductor in magnetic coupling with the second layer, the write conductor being along the hard axis.

* * * * *